(12) United States Patent
Liang et al.

(10) Patent No.: US 8,432,198 B2
(45) Date of Patent: Apr. 30, 2013

(54) INJECTION-LOCKED PHASE-LOCKED LOOP WITH A SELF-ALIGNED INJECTION WINDOW

(75) Inventors: Che-Fu Liang, Yonghe (TW); Keng-Jan Hsiao, Taoyuan (TW)

(73) Assignee: Mediatek Inc., Hsin-Chu (TW)

( * ) Notice: Subject to any disclaimer, the term of this patent is extended or adjusted under 35 U.S.C. 154(b) by 38 days.

(21) Appl. No.: 13/225,274

(22) Filed: Sep. 2, 2011

(65) Prior Publication Data

US 2012/0062293 A1    Mar. 15, 2012

Related U.S. Application Data

(60) Provisional application No. 61/381,618, filed on Sep. 10, 2010.

(51) Int. Cl.
*H03L 7/06*    (2006.01)
(52) U.S. Cl.
USPC ............ 327/156; 327/147; 327/149; 327/159
(58) Field of Classification Search .................. 327/141, 327/144–163; 331/1/A, 15–17; 375/373–376
See application file for complete search history.

(56) References Cited

U.S. PATENT DOCUMENTS

| | | | |
|---|---|---|---|
| 6,256,361 B1 * | 7/2001 | Mozetic et al. | 375/360 |
| 6,369,659 B1 * | 4/2002 | Delzer et al. | 331/10 |
| 2009/0175116 A1 * | 7/2009 | Song et al. | 365/233.12 |
| 2010/0259305 A1 * | 10/2010 | Lee et al. | 327/157 |
| 2012/0062287 A1 * | 3/2012 | Jang et al. | 327/156 |

OTHER PUBLICATIONS

Ye, S., et al.; "A Multiple-Crystal Interface PLL With VCO Realignment to Reduce Phase Noise;" IEEE Journal of Solid-State Circuits; vol. 37; No. 12; Dec. 2002; pp. 1795-1803.

* cited by examiner

*Primary Examiner* — Lincoln Donovan
*Assistant Examiner* — Brandon S Cole
(74) *Attorney, Agent, or Firm* — McClure, Qualey & Rodack, LLP

(57) ABSTRACT

An injection-locked phase-locked loop (ILPLL) with a self-aligned injection window is disclosed. In the ILPLL, a phase detector is provided to detect a phase difference between a pair of differential terminals of an injection-locked voltage-controlled oscillator (ILVCO) of the ILPLL. According to the detection, the phase detector generates a control signal, to align an oscillation output, generated from the pair of differential terminals of the ILVCO, with an injection pulse utilized in the ILVCO.

18 Claims, 6 Drawing Sheets

INJECTION-LOCKED PHASE-LOCKED LOOP WITH A SELF-ALIGNED INJECTION WINDOW

CROSS REFERENCE TO RELATED APPLICATIONS

This application claims the benefit of U.S. Provisional Application No. 61/381,618 filed on Sep. 10, 2010, the entirety of which is incorporated by reference herein.

BACKGROUND OF THE INVENTION

1. Field of the Invention

The present invention relates to phase-locked loops (PLLs), and in particular relates to injection-locked phase-locked loops (ILPLLs).

2. Description of the Related Art

In modern analog front end designs, there is an increasing demand for high performance analog-to-digital converters, which require a high sampling frequency and a low jitter clock. Thus, phase-locked loops (PLLs) with jitter in the order of a few picoseconds have become a desirable choice.

To get better phase noise, a wider loop bandwidth is needed to suppress the noise of voltage-controlled oscillators (VCOs) of the PLLs. For a wider loop bandwidth of a PLL, an injection-locked technique is introduced in the VCO design of the PLL. However, improper injection timing may cause destructive disturbance. Thus, an injection timing alignment technique is called for.

BRIEF SUMMARY OF THE INVENTION

Injection-locked phase-locked loops with a self-aligned injection windows are disclosed.

An injection-locked phase-locked loop in accordance with an exemplary embodiment of the invention comprises a loop filter, an injection pulse generator, an injection-locked voltage-controlled oscillator and a phase detector. The loop filter provides a control voltage. The injection pulse generator generates an injection pulse based on a reference oscillation signal. The injection-locked voltage-controlled oscillator is controlled by the control voltage and the injection pulse, and has a pair of differential terminals for generation of an oscillation output. The control voltage is operative to adjust a frequency and/or a phase of the oscillation output, and, the oscillation output is aligned with the injection pulse wherein a phase difference between the oscillation output and the injection pulse is limited within a predetermined range. The phase detector is coupled to the pair of differential terminals of the injection-locked voltage-controlled oscillator, and is controlled by the injection pulse. According to the injection pulse, the phase detector detects a phase difference between signals on the pair of differential terminals and thereby generates a control signal. The control signal is operative to further adjust the phase difference between the oscillation output and the injection pulse.

In some embodiments, the phase detector comprises a sample and hold circuit and a voltage-to-current converter. According to the injection pulse, the sample and hold circuit samples and holds the signals at the pair of differential terminals of the injection-locked voltage-controlled oscillator and thereby generates a first sample and hold output and a second sample and hold output. The voltage-to-current converter converts a voltage difference between the first and second sample and hold outputs to a current output, and provides the current output as the control signal.

In some embodiments, the current output provided by the voltage-to-current converter of the phase detector may be coupled to the loop filter to adjust the control voltage. In this manner, the phase and frequency of the oscillation output is adjusted and thereby the difference between the oscillation output and the injection pulse is adjusted. Thus, an injection window self-alignment is achieved.

In other embodiments, the injection-locked phase-locked loop further comprises a delay line. The delay line is coupled to the injection pulse generator, and is driven by the current output provided by the voltage-to-current converter of the phase detector. In this manner, the phase of the injection pulse is adjusted and thereby the difference between the oscillation output and the injection pulse is adjusted. Thus, an injection window self-alignment is achieved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
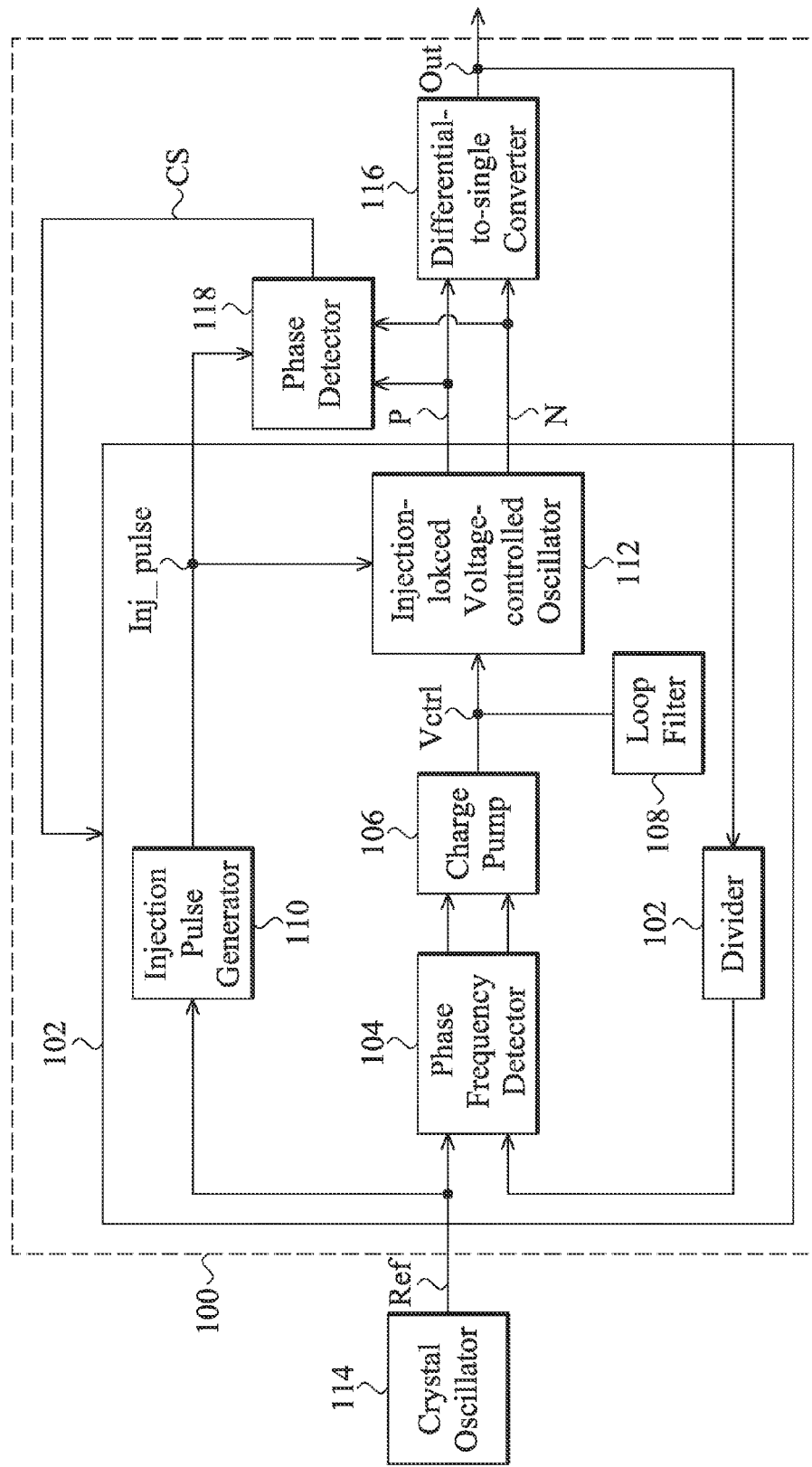
FIG. 1 depicts an injection-locked phase-locked loop (IL-PLL) 100 in accordance with an exemplary embodiment of the invention.

FIG. 1 depicts an injection-locked phase-locked loop (IL-PLL) 100 in accordance with an exemplary embodiment of the invention.

In block 102, a phase-locked loop (PLL) using an injection-locked technique but incapable of injection window self-alignment is shown. In comparison with conventional PLL design (without injection-locking), the PLL block 102 also contains a divider 102, a phase frequency detector 104, a charge pump 106 and a loop filter 108. However, the PLL 102 introduces an injection pulse generator 110 and an injection-locked voltage-controlled oscillator (ILVCO) 112 to substitute for the conventional voltage-controlled oscillators of conventional PLLs. The injection pulse generator 110 is coupled to a crystal oscillator 114. Based on a reference oscillation signal Ref from the crystal oscillator 114, the injection pulse generator 110 generates an injection pulse Inj_pulse. In some embodiments, the injection pulse generator 110 may generate the injection pulse Inj_pulse by reducing the duty cycle of the reference oscillation signal Ref. The ILVCO 112 receives the injection pulse Inj_pulse as well as the control voltage Vctrl. As shown, the ILVCO 112 has a pair of differential terminals (providing differential signals P and N and also labeled as 'P' and "N' hereinafter), and the differential signals P and N are coupled to a differential-to-single converter 116 for the generation of an oscillation output Out. Based on the control voltage Vctrl, the ILVCO 112 adjusts the differential signals P and N and thereby a frequency and/or a phase of the oscillation output Out are adjusted. Based on the injection pulse Inj_pulse, an injection-locked technique is performed in the ILVCO 112. By the injection-locked technique, the differential signals P and N are aligned to the injection pulse Inj_pulse so that the oscillation output Out is aligned with the injection pulse Inj_pulse, wherein a phase difference between the oscillation output Out and the injection pulse Inj_pulse is limited within a predetermined range (depending on the strength of the injection-locked technique). Consequently, the bandwidth of the entire loop shown in FIG. 1 is wider than that of conventional PLLs and hence low jitter is achieved.

To self-align the injection window of the injection-locked design of the PLL block 102, a phase detector 118 is introduced. The phase detector 118 is coupled to the pair of differential terminals P and N of the ILVCO 112 and is controlled by the injection pulse Inj_pulse. According to the injection pulse Inj_pulse, the phase detector 118 detects a phase difference between the pair of differential terminals P and N and thereby generates a control signal CS. The control signal CS is fed to the PLL block 102, to assist in adjusting the phase difference between the oscillation output Out and the injection pulse Inj_pulse (i.e., adjusting the mismatch between the PLL block and the injection pulse generator). In this manner, proper injection timing is achieved, and a self-alignment loop for the injection window is provided.

Figure 2:
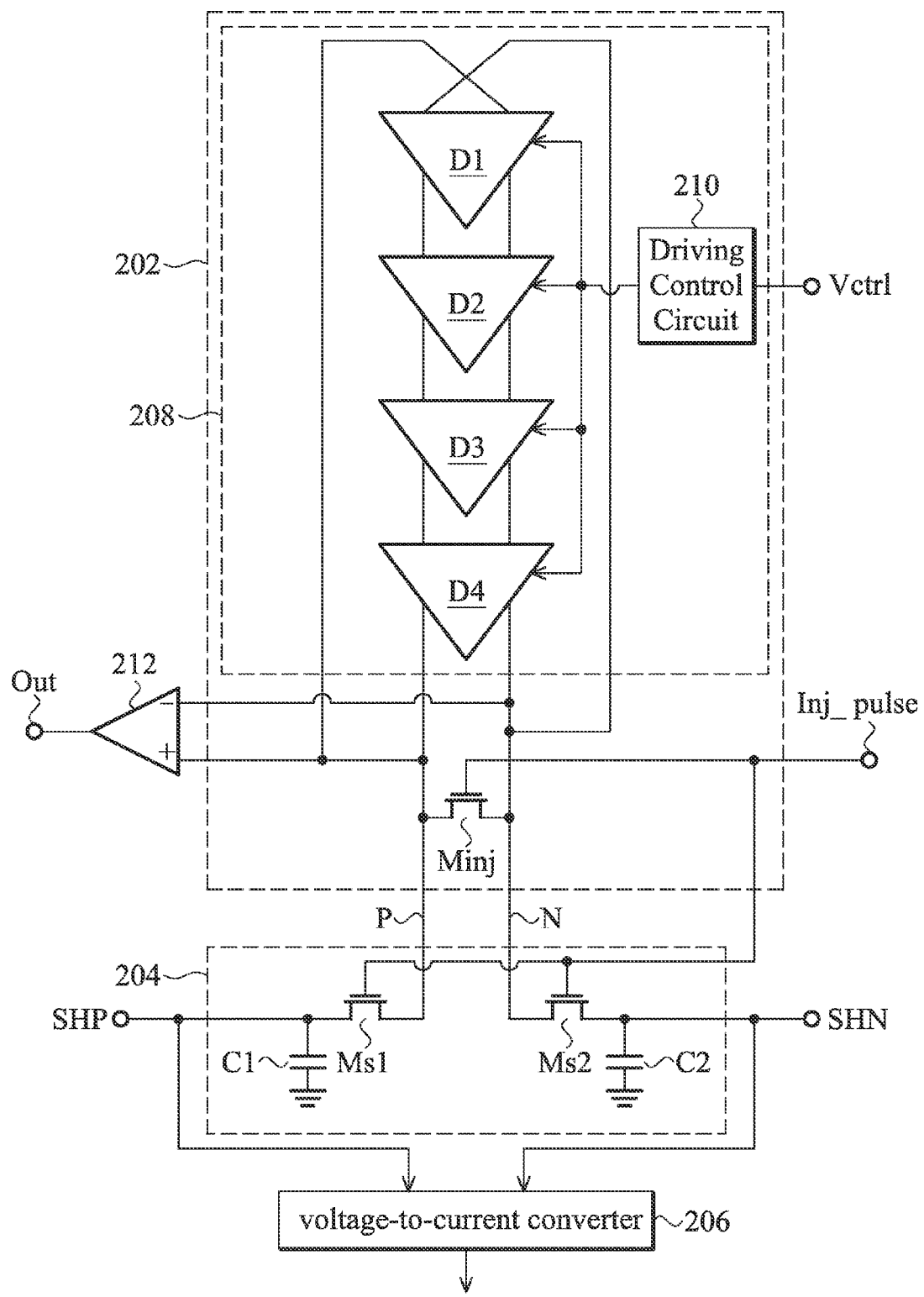
FIG. 2 depicts an exemplary embodiment of the invention, illustrating an injection-locked voltage-controlled oscillator 202, a phase detector (including a sample and hold circuit 204 and a voltage-to-current converter 206), and a differential-to-single converter 212.

FIG. 2 depicts an exemplary embodiment of the invention, illustrating an injection-locked voltage-controlled oscillator (ILVCO) 202, a phase detector (including a sample and hold circuit 204 and a voltage-to-current converter 206), and a differential-to-single converter 212.

In the embodiment of FIG. 2, the ILVCO 202 includes a differential ring oscillator 208 and an injection switch Minj. The oscillator size can be shrunk by the ring architecture. The injection switch Minj is operative for the injection-locked technique.

The differential ring oscillator 208 includes a driving control circuit 210 and stages of differential delay cells D1-D4. The driving control circuit 210 powers the differential delay cells D1-D4 according to the control voltage Vctrl such that the oscillation provided by the cascaded differential delay cells D1-D4 is adjusted. The differential outputs of any of the differential delay cells D1 . . . D4 may be coupled to a differential-to-single converter for the generation of an oscillation output. In this embodiment, the differential outputs of the differential delay cell D4 are coupled to an operational amplifier 212 to generate an oscillation output Out. Additionally, the differential outputs of the delay cell D4 are further coupled to the phase detector (including a sample and hold circuit 204 and a voltage-to-current converter 206) as the pair of differential terminals P and N. Note that the pair of differential terminals P and N are not limited to the differential outputs of the differential delay cell D4. In other embodiments, the differential outputs of another differential delay cell D1, or D2 or D3 may be utilized as the pair of differential terminals P and N. Furthermore, note that the differential ring oscillator 208 may be replaced by other oscillator architectures. Oscillators capable of providing two differential outputs are suitable.

Figure 3A:
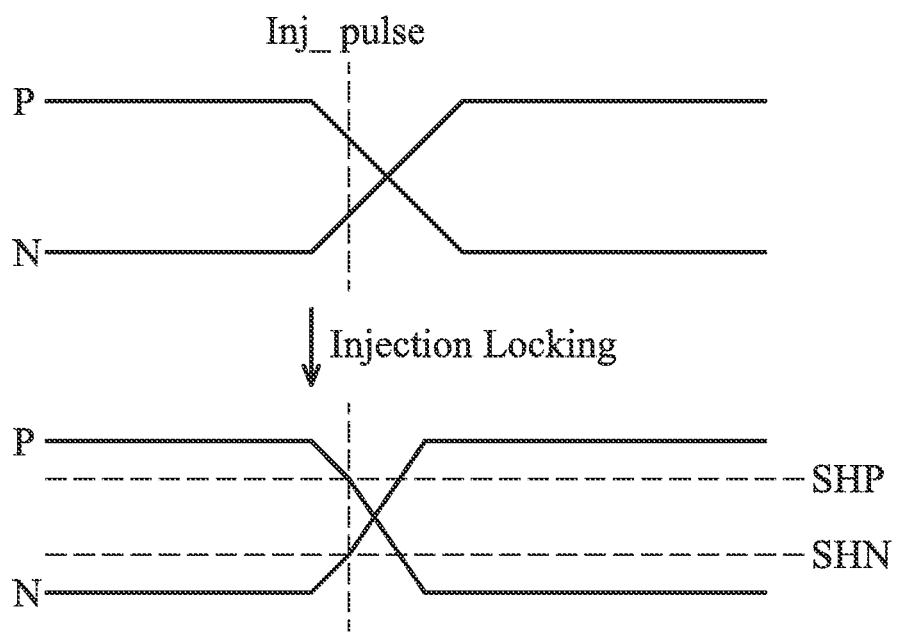
FIGS. 3A and 3B depict an injection-locked technique.
Figure 3B:
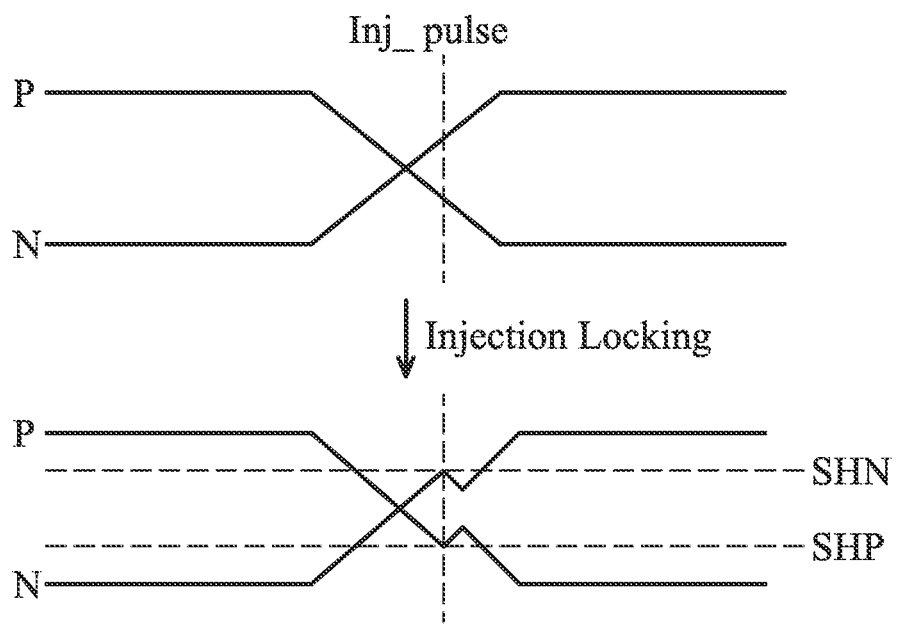

As for the injection switch Minj, it is coupled between the differential outputs of the differential delay cell D4 (the pair of differential terminals P and N) and is turned on according to the injection pulse Inj_pulse. To help understand the injection-locked technique, FIGS. 3A and 3B illustrate the effect of injection-locking. The upper waveforms of FIG. 3A show a case wherein the phase of the oscillation (observed from signals P and N) of a differential ring oscillator lags an injection pulse Inj_pulse. By the injection-locking procedure, referring to the lower waveforms of FIG. 3A, the lag of the oscillation of the differential ring oscillator and the injection pulse Inj_pulse is limited within a predetermined range. The predetermined range depends on the injection-locking design. A wider loop bandwidth is achieved by the injection-locked technique. On the contrary, the upper waveforms of FIG. 3B show a case wherein the phase of the oscillation (observed from signals P and N) of a differential ring oscillator leads an injection pulse Inj_pulse. By the injection-locking procedure, referring to the lower waveforms of FIG. 3B, the lead of the oscillation of the differential ring oscillator and the injection pulse Inj_pulse is limited within the predetermined range. There is one way to determine the strength of the injection-locked technique. The phase errors before and after the injection-locking procedure are $\phi$ and $\phi'$, respectively. Thus, an injection strength $\beta$ may be defined as $\beta=(\phi-\phi')/\phi$.

Referring back to FIG. 2, this paragraph discusses the phase detector formed by the sample and hold circuit 204 and the voltage-to-current converter 206. The sample and hold circuit 204 is coupled to the pair of differential terminals P and N provided by the ILVCO 202. According to the injection pulse Inj_pulse, the sample and hold circuit 204 samples and holds the differential signals P and N to generate a first sample and hold output SHP and a second sample and hold output SHN. Referring to the lower waveforms of FIG. 3A or FIG. 3B, the voltage levels of the first and the second sample and hold outputs SHP and SHN sampled according to the injection pulse Inj_pulse are shown. The voltage-to-current converter 206 converts a voltage difference between the first and second sample and hold outputs SHP and SHN to a current output, to work as the control signal CS.

In this embodiment of FIG. 2, the sample and hold circuit 204 comprises a first capacitor C1, a second capacitor C2, a first sample switch Ms1 and a second sample switch Ms2. The first capacitor C1 and the first sample switch Ms1 take charge of the sample and hold of the signal P while the second capacitor C2 and the second sample switch Ms2 take charge of the sample and hold of the signal N. The first and second sample switches Ms1 and Ms2 are both turned on according to the injection pulse Inj_pulse so that the status of the differential terminals P and N are sampled and held by the first and second capacitors C1 and C2 as the first and second sample and hold outputs SHP and SHN. Note that the circuit 204 is not intended to limit the design of the sample and hold circuit. The circuit 204 may be replaced by other well-known sample and hold designs.

Figure 4:
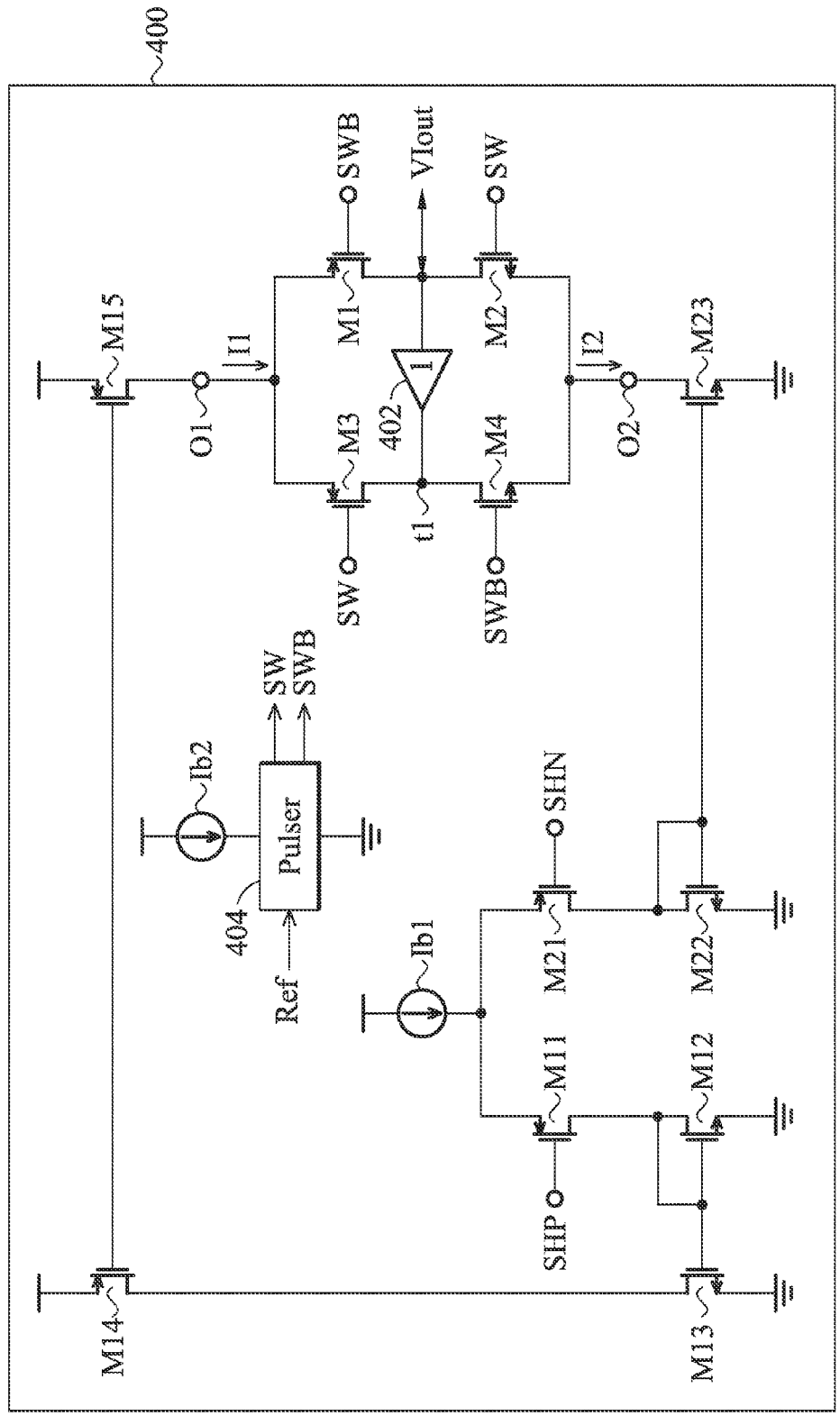
FIG. 4 depicts a voltage-to-current converter 400 in accordance with an exemplary embodiment of the invention.

FIG. 4 depicts a voltage-to-current converter 400 in accordance with an exemplary embodiment of the invention. In the voltage-to-current converter 400, a first bias current source Ib1 is shared by a first current mirror (formed by the MOSs M11, M12, M13, M14 and M15) and a second current mirror (formed by the MOSs M21, M22 and M23). According to the first and second sample and hold outputs SHP and SHN, the first and second current mirrors generate a first current I1 and a second current I2. The first and second current mirrors are coupled to an output terminal VIout of the voltage-to-current converter 400 to provide a current difference between the first and second currents I1 and I2 as the current output of the voltage-to-current converter.

In the voltage-to-current converter 400 of FIG. 4, four switches M1-M4 and a unit gain buffer 402 are introduced to couple the first and second current mirrors to the output terminal VIout of the voltage-to-current converter 400, and a pulser 404 is introduced to control the four switches M1-M4. To control the four switches M1-M4, the pulser 404 generates a current path setting pulse SW and an inverted signal SWB of the current path setting pulse SW. The first switch M1 may be implemented by a PMOS and is turned on according to the inverted signal SWB of the current path setting pulse SW, to couple an output terminal O1 of the first current mirror to the output terminal VIOUT of the voltage-to-current converter 400. The second switch M2 may be implemented by an NMOS and is turned on according to the current path setting pulse SW, to couple an output terminal O2 of the second current mirror to the output terminal VIOUT of the voltage-to-current converter 400. The third switch M3 and the fourth switch M4 are connected at a connection terminal t1, and may be implemented by a PMOS and an NMOS, respectively. The third switch M3 is turned on according to the current path setting pulse SW, to couple the output terminal O1 of the first current mirror to the connection terminal t1. The fourth switch M4 is turned on according to the signal SWB, to couple the output terminal O2 of the second current mirror to the connection terminal t1. The unit gain buffer 402 has an input terminal coupled to the output terminal VIout of the voltage-to-current converter 400 and has an output terminal coupled to the connection terminal t1. As shown, the voltage-to-current converter 400 provides current output (via the output terminal VIout) only when the control path setting pulse SW is active. Note that the four switches M1-M4, the unit gain buffer 402 and the pulser 404 are optional components of the voltage-to-current converter 400. In comparison with a voltage-to-current converter without the optional components, the magnitude of the current output of the voltage-to-current converter 400 is operated at a proper level rather than an excessively small one since the active time of the voltage-to-current converter 400 is limited. In this manner, noise of the voltage-to-current conversion is effectively suppressed, especially the in-band phase noise.

The embodiment of FIG. 4 further shows that the pulser 404 may be biased by a second bias current source Ib2. To reduce the effect of on-chip variations, the second bias current source Ib2 may be a mirrored one of the first bias current source Ib1. Furthermore, as shown, the pulser 404 may generate the current path setting pulse SW and the inverted signal SWB based on the reference oscillation signal Ref from the crystal oscillator (114 of FIG. 1).

Figure 5:
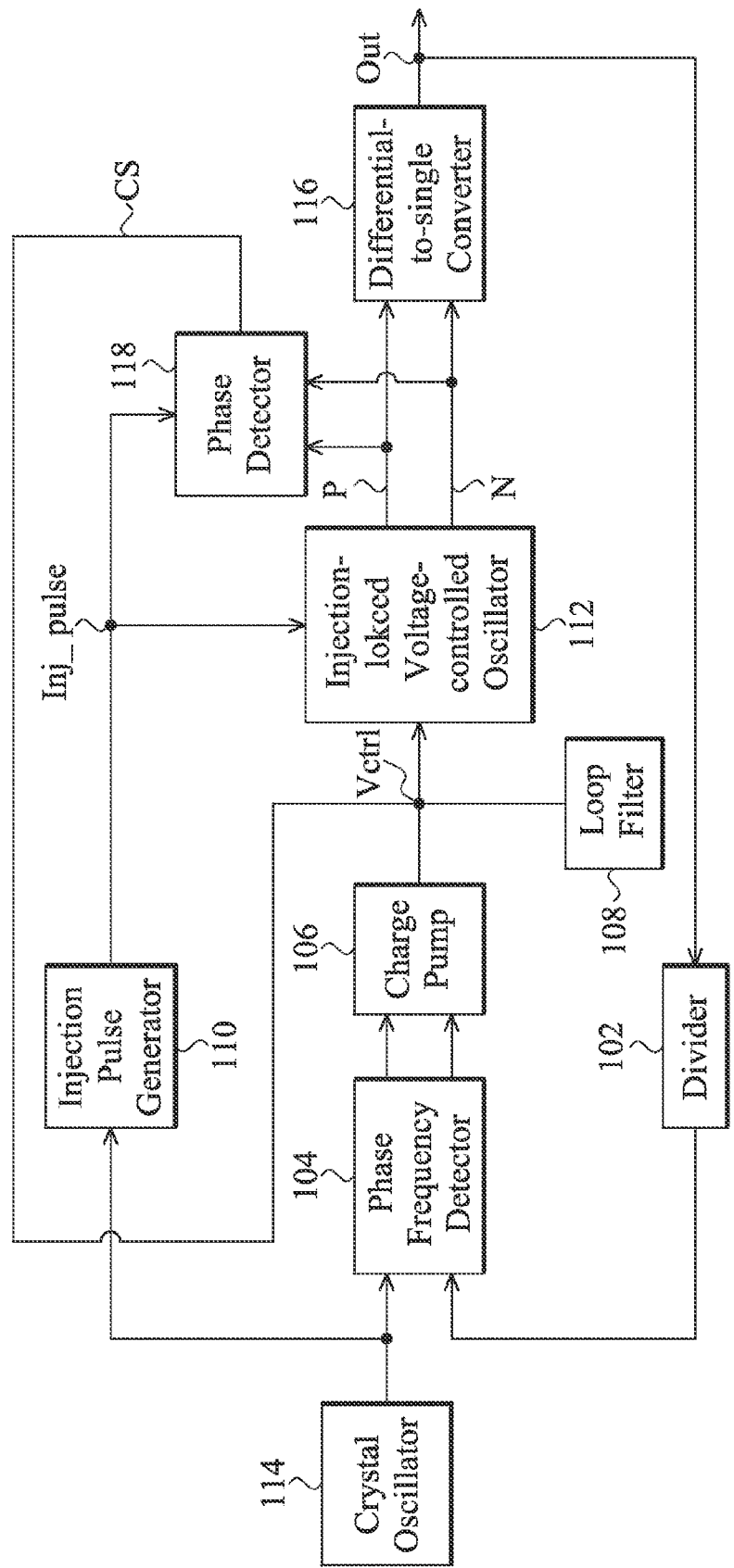
FIG. 5 depicts another ILPLL in accordance with an exemplary embodiment of the invention, wherein the control signal CS provided by the phase detector 118 (for example, a current output) is coupled to the loop filter 108 to adjust the control voltage Vctrl.

FIG. 5 depicts another ILPLL in accordance with the invention, wherein the control signal CS provided by the phase detector 118 (for example, a current output) is coupled to the loop filter 108 to adjust the control voltage Vctrl. In some embodiments, the phase detector 118 does not work initially until the frequency of the oscillation output Out is stable (e.g., reaches a predetermined level). The oscillation output Out is refined by the detection of the phase detector 118 and the adjustment of the control voltage Vctrl. In this manner, the phase difference between the oscillation output Out and the injection pulse Inj_pulse is adjusted and thereby the injection window of the injection-locked technique is improved. Injection window self-alignment is achieved by this architecture.

Figure 6:
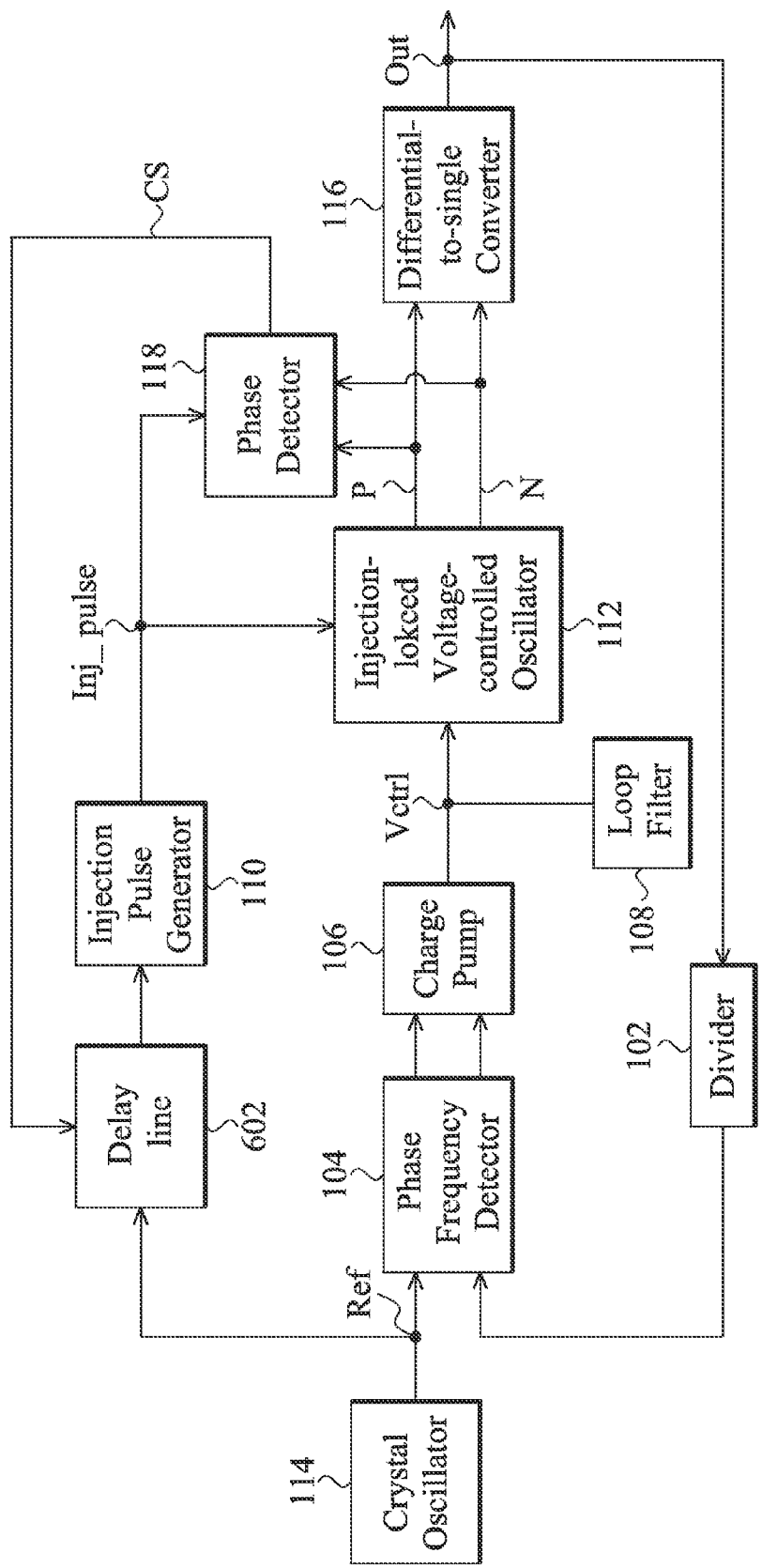
FIG. 6 depicts another ILPLL in accordance with an exemplary embodiment of the invention, wherein a delay line 602 is introduced and the control signal CS provided by the phase detector 118 (for example, a current output) is operative to drive the delay line 602.

FIG. 6 depicts another ILPLL in accordance with the invention, wherein a delay line 602 is introduced. As shown, the delay line 602 is coupled between the crystal oscillator 114 and the injection pulse generator 110 and is driven by the control signal CS (for example, a current output) provided by the phase detector 118. In this manner, the phase of the injection pulse Inj_pulse is adjusted by the detection of the phase detector 118 and the delay control of the delay line 602. In this manner, the phase difference between the oscillation output Out and the injection pulse Inj_pulse is adjusted and thereby the injection window of the injection-locked technique is improved. Injection window self-alignment is achieved by this architecture.

Note that the architecture of FIG. 5 or 6 is not intended to limit the scope of the invention. The control signal CS provided by the phase detector 118 may be applied in controlling other components of a conventional PLL. The disclosed concept involves using the detection of the phase detector 118 to adjust the phase difference between the oscillation output Out and the injection pulse Inj_pulse and thereby achieve an injection-window alignment design.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An injection-locked phase-locked loop with a self-aligned injection window, comprising:
    a loop filter, providing a control voltage;
    an injection pulse generator, generating an injection pulse based on a reference oscillation signal;
    an injection-locked voltage-controlled oscillator, controlled by the control voltage and the injection pulse, and having a pair of differential terminals for generation of an oscillation output, wherein the control voltage is operative to adjust a frequency and/or a phase of the oscillation output, and the oscillation output is aligned with the injection pulse to limit a phase difference between the oscillation output and the injection pulse; and
    a phase detector, coupled to the pair of differential terminals of the injection-locked voltage-controlled oscillator to detect, according to the injection pulse, a phase difference between signals on the pair of differential terminals and thereby generate a control signal, wherein the control signal is operative to further adjust the phase difference between the oscillation output and the injection pulse.

2. The injection-locked phase-locked loop as claimed in claim 1, wherein the phase detector comprises:
    a sample and hold circuit, sampling and holding the signals at the pair of differential terminals of the injection-locked voltage-controlled oscillator according to the injection pulse, to generate a first sample and hold output and a second sample and hold output; and
    a voltage-to-current converter, providing the control signal by converting a voltage difference between the first and second sample and hold outputs to a current output.

3. The injection-locked phase-locked loop as claimed in claim 2, wherein the current output generated by the voltageto-current converter of the phase detector is coupled to the loop filter to adjust the control voltage.

4. The injection-locked phase-locked loop as claimed in claim 3, further comprising:
   a divider, generating a frequency-divided oscillation signal by dividing the frequency of the oscillation output;
   a phase and frequency detector, detecting a phase difference and a frequency difference between the frequency-divided oscillation signal and the reference oscillation signal to generate charge pump control signals; and
   a charge pump, controlled by the charge pump control signals for adjusting the control voltage provided by the loop filter.

5. The injection-locked phase-locked loop as claimed in claim 3, wherein the injection-locked voltage-controlled oscillator comprises:
   a differential ring oscillator, wherein one stage thereof provides differential outputs as the pair of differential terminals; and
   an injection switch, turned on according to the injection pulse to short the pair of differential terminals.

6. The injection-locked phase-locked loop as claimed in claim 5, wherein the sample and hold circuit of the phase detector comprises:
   a first capacitor and a second capacitor; and
   a first sample switch and a second sample switch, both turned on according to the injection pulse, to couple the pair of differential terminals of the injection-locked voltage-controlled oscillator to the first and second capacitors, respectively,
   wherein the first and second capacitors provide the first and second sample and hold outputs, respectively.

7. The injection-locked phase-locked loop as claimed in claim 3, wherein the voltage-to-current converter of the phase detector comprises:
   a first bias current source; and
   a first current mirror and a second current mirror, sharing the first bias current source to generate a first current and a second current according to the first and second sample and hold outputs,
   wherein the first current mirror and the second current mirror are coupled to an output terminal of the voltage-to-current converter to provide a current difference between the first and the second currents as the current output of the voltage-to-current converter.

8. The injection-locked phase-locked loop as claimed in claim 7, wherein the voltage-to-current converter of the phase detector further comprises:
   a pulser, generating a current path setting pulse;
   a first switch, turned on according to an inverted signal of the current path setting pulse to couple an output terminal of the first current mirror to the output terminal of the voltage-to-current converter;
   a second switch, turned on according to the current path setting pulse to couple an output terminal of the second current mirror to the output terminal of the voltage-to-current converter;
   a third switch and a fourth switch, connected at a connection terminal, wherein the third switch is turned on according to the current path setting pulse to couple the output terminal of the first current mirror to the connection terminal, and the fourth switch is turned on according to the inverted signal of the current path setting pulse to couple the connection terminal to the output terminal of the second current mirror; and
   a unit gain buffer, having an input terminal coupled to the output terminal of the voltage-to-current converter, and having an output terminal coupled to the connection terminal between the third and the fourth switches.

9. The injection-locked phase-locked loop as claimed in claim 8, wherein the pulser is biased by a second bias current source which mirrors the first bias current source.

10. The injection-locked phase-locked loop as claimed in claim 8, wherein the pulser generates the current path setting pulse based on the reference oscillation signal from the crystal oscillator.

11. The injection-locked phase-locked loop as claimed in claim 2, further comprising:
    a delay line, coupled to the injection pulse generator, and driven by the current output from the voltage-to-current converter of the phase detector.

12. The injection-locked phase-locked loop as claimed in claim 11, further comprising:
    a divider, generating a frequency-divided oscillation signal by dividing the frequency of the oscillation output;
    a phase and frequency detector, detecting a phase difference and a frequency difference between the frequency-divided oscillation signal and the reference oscillation signal to generate charge pump control signals; and
    a charge pump, controlled by the charge pump control signals for adjusting the control voltage provided by the loop filter.

13. The injection-locked phase-locked loop as claimed in claim 11, wherein the injection-locked voltage-controlled oscillator comprises:
    a differential ring oscillator, wherein one stage thereof provides differential outputs as the pair of differential terminals; and
    an injection switch, turned on according to the injection pulse to short the pair of differential terminals.

14. The injection-locked phase-locked loop as claimed in claim 13, wherein the sample and hold circuit of the phase detector comprises:
    a first capacitor and a second capacitor; and
    a first sample switch and a second sample switch, both turned on according to the injection pulse, to couple the pair of differential terminals of the injection-locked voltage-controlled oscillator to the first and second capacitors, respectively,
    wherein the first and second capacitors provide the first and second sample and hold outputs, respectively.

15. The injection-locked phase-locked loop as claimed in claim 11, wherein the voltage-to-current converter of the phase detector comprises:
    a first bias current source; and
    a first current mirror and a second current mirror, sharing the first bias current source to generate a first current and a second current according to the first and second sample and hold outputs,
    wherein the first current mirror and the second current mirror are coupled to an output terminal of the voltage-to-current converter to provide a current difference between the first and the second currents as the current output of the voltage-to-current converter.

16. The injection-locked phase-locked loop as claimed in claim 15, wherein the voltage-to-current converter of the phase detector further comprises:
    a pulser, generating a current path setting pulse;
    a first switch, turned on according to an inverted signal of the current path setting pulse to couple an output terminal of the first current mirror to the output terminal of the voltage-to-current converter;

a second switch, turned on according to the current path setting pulse to couple an output terminal of the second current mirror to the output terminal of the voltage-to-current converter;

a third switch and a fourth switch, connected at a connection terminal, wherein the third switch is turned on according to the current path setting pulse to couple the output terminal of the first current mirror to the connection terminal, and the fourth switch is turned on according to the inverted signal of the current path setting pulse to couple the connection terminal to the output terminal of the second current mirror; and a unit gain buffer, having an input terminal coupled to the output terminal of the voltage-to-current converter, and having an output terminal coupled to the connection terminal between the third and the fourth switches.

17. The injection-locked phase-locked loop as claimed in claim 16, wherein the pulser is biased by a second bias current source which mirrors the first bias current source.

18. The injection-locked phase-locked loop as claimed in claim 16, wherein the pulser generates the current path setting pulse based on the reference oscillation signal from the crystal oscillator.

\* \* \* \* \*